(12) United States Patent
Briggs et al.

(10) Patent No.: US 9,966,337 B1
(45) Date of Patent: May 8, 2018

(54) FULLY ALIGNED VIA WITH INTEGRATED AIR GAPS

(71) Applicant: International Business Machines Corporation, Armonk, NY (US)

(72) Inventors: Benjamin D. Briggs, Waterford, NY (US); Lawrence A. Clevenger, LaGrangeville, NY (US); Huai Huang, Clifton Park, NY (US); Christopher J. Penny, Saratoga Springs, NY (US); Michael Rizzolo, Albany, NY (US); Hosadurga K. Shobha, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days. days.

(21) Appl. No.: 15/459,684

(22) Filed: Mar. 15, 2017

(51) Int. Cl.
| | |
|---|---|
| *H01L 23/522* | (2006.01) |
| *H01L 21/768* | (2006.01) |
| *H01L 23/528* | (2006.01) |
| *H01L 23/532* | (2006.01) |

(52) U.S. Cl.
CPC ...... *H01L 23/5226* (2013.01); *H01L 21/7682* (2013.01); *H01L 21/76879* (2013.01); *H01L 23/53238* (2013.01)

(58) Field of Classification Search
None
See application file for complete search history.

(56) References Cited

U.S. PATENT DOCUMENTS

| | | |
|---|---|---|
| 6,281,585 B1 | 8/2001 | Bothra |
| 6,492,732 B2 | 12/2002 | Lee et al. |
| 6,975,032 B2 | 12/2005 | Chen et al. |
| 7,399,646 B2 | 7/2008 | Kanakasabapathy et al. |
| 8,900,988 B2 | 12/2014 | Lin et al. |
| 9,324,650 B2 | 4/2016 | Edelstein et al. |
| 9,368,395 B1 | 6/2016 | Wei et al. |
| 9,391,020 B2 | 7/2016 | Zhang et al. |
| 2012/0313251 A1* | 12/2012 | Kato ................ H01L 21/76811 257/773 |
| 2014/0363969 A1 | 12/2014 | Chen et al. |
| 2015/0093702 A1* | 4/2015 | Nyhus ................ G03F 7/0392 430/270.1 |

OTHER PUBLICATIONS

B. D. Briggs et al., "Selective Recessing to Form a Fully Aligned Via," U.S. Appl. No. 15/229,470, filed Aug. 5, 2016.

* cited by examiner

*Primary Examiner* — Khaja Ahmad
(74) *Attorney, Agent, or Firm* — Cantor Colburn LLP; Vazken Alexanian (57) ABSTRACT

A wafer is provided. The wafer includes a dielectric layer, first and second metallization layer interconnects arrayed across the dielectric layer with the second metallization layer interconnects adjacent one another and surrounded by the first metallization layer interconnects and a cap. The first and second metallization layer interconnects have respective upper surfaces defining a first plane and a second plane recessed from the first plane, respectively. The cap is disposed on exposed surfaces of the second metallization layer interconnects and portions of the dielectric layer adjacent to the second metallization layer interconnects.

12 Claims, 9 Drawing Sheets

FULLY ALIGNED VIA WITH INTEGRATED AIR GAPS

BACKGROUND

The present invention relates in general to wafer fabrication. More particularly, the present invention relates to wafer fabrication processes in which a fully aligned via (FAV) is formed with integrated air gaps.

The fabrication of very-large scale integrated (VLSI) or ultra-large scale integrated (ULSI) circuits requires an interconnect structure including metallic wiring that connects individual devices in a semiconductor chip to one another. Typically, the wiring interconnect network includes two types of features that serve as electrical conductors. These are line features that traverse a distance across the chip and via features which connect lines in different levels. Typically, the conducting metal lines and vias are formed of aluminum or copper and are insulated by the interlayer dielectrics (ILD) which are electrical insulators.

SUMMARY

According to embodiments of the present invention, a wafer is provided. The wafer includes a dielectric layer, first and second metallization layer interconnects arrayed across the dielectric layer with the second metallization layer interconnects adjacent one another and surrounded by the first metallization layer interconnects and a cap. The first and second metallization layer interconnects have respective upper surfaces defining a first plane and a second plane recessed from the first plane, respectively. The cap is disposed on exposed surfaces of the second metallization layer interconnects and portions of the dielectric layer adjacent to the second metallization layer interconnects.

According to embodiments of the present invention, a processing method for a wafer is provided. The wafer includes central, lateral and outer metallization layer interconnects arrayed across a dielectric layer. The processing method includes using a single mask exposure to recess only the central and lateral metallization layer interconnects. Air gaps are formed in a secondary dielectric layer in defined air gap regions adjacent to the outer metallization layer interconnects. A fully-aligned via (FAV) is formed through at least the secondary dielectric for electrical communication with the central metallization layer interconnect.

According to embodiments of the present invention, a processing method for a wafer is provided. The wafer includes central, lateral and outer metallization layer interconnects arrayed across a dielectric layer. The processing method includes recessing the central and lateral metallization layer interconnects and forming a protective cap over the recessed central and lateral metallization layer interconnects. The processing method further includes defining air gap regions adjacent to the outer metallization layer interconnects in the dielectric layer and forming a secondary cap on exposed surfaces of the lateral and outer metallization layer interconnects, the dielectric layer and the protective cap. In addition, the processing method further includes non-conformally depositing a secondary dielectric layer over the secondary cap to form air gaps in the air gap regions, defining a trench extending through the secondary dielectric layer, the secondary cap and the protective cap to the central metallization layer interconnect and forming a fully-aligned via (FAV) in the trench for electrical communication with the central metallization layer interconnect.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As will be described below, embodiment of the invention provide wafer fabrication processes in which a fully aligned via (FAV) is formed with integrated air gaps. This is done through the use of a single mask exposure to recess metallization in only fully aligned via (FAV) regions while also creating air gaps in air gaps regions. That is, the wafer fabrication processes provide for localized metallization recessing, which does not require more than one masking process and avoids the problems of higher line resistances arising from global metallization recessing.

Figure 1:
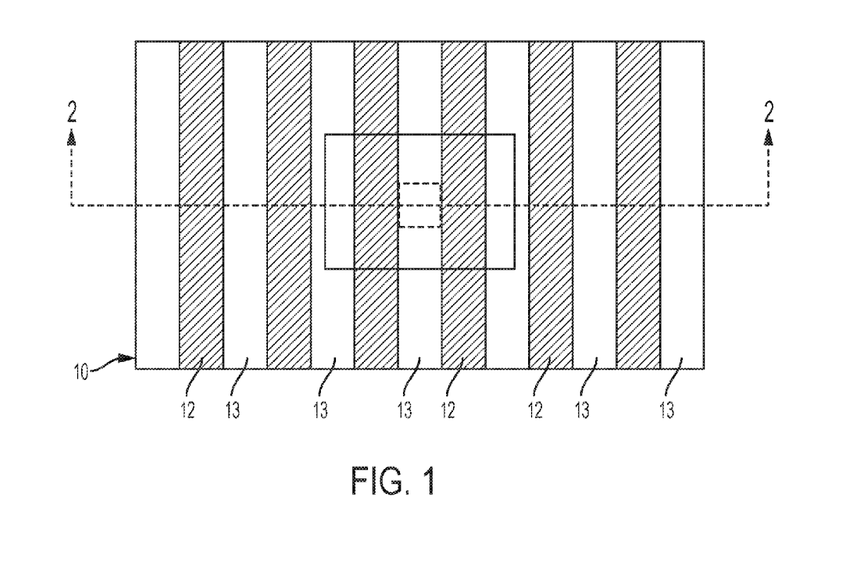
FIG. 1 is a top down view of a wafer in accordance with embodiments of the invention.
Figure 2:
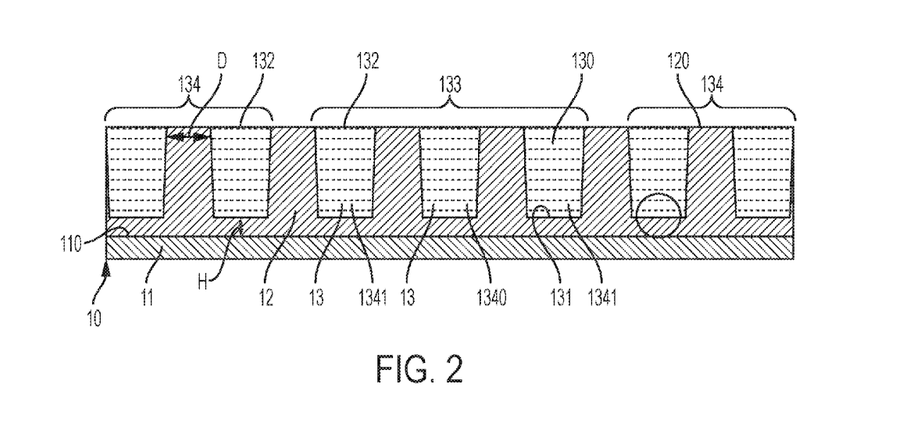
FIG. 2 is a cross-sectional side view of the wafer of FIG. 1 taken along line 2-2.
Figure 3:
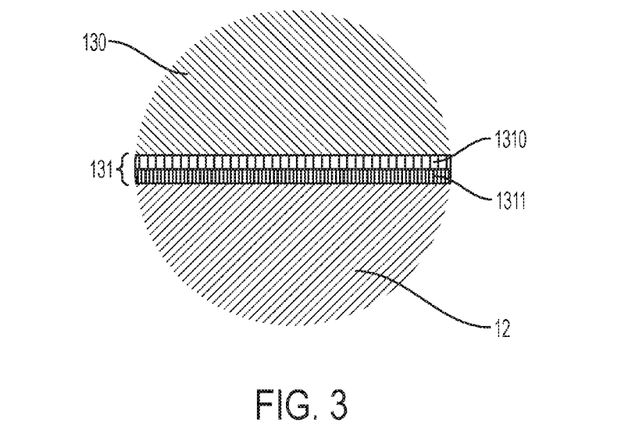
FIG. 3 is an enlarged view of the encircled portion of FIG. 2 in accordance with embodiments of the invention.

With reference to FIGS. 1-3, a wafer 10 is provided and includes a substrate 11, a first dielectric layer 12 and a plurality of metallization layer (Mx) interconnects 13 that are arrayed across the first dielectric layer 12. The substrate 11 can be provided as a semiconductor substrate or as another type of substrate and the first dielectric layer 12 can be provided as an interlayer dielectric (ILD) which is electrically non-conductive so that the metallization layer interconnect lines (hereinafter referred to as "metallization layer interconnects") 13 are insulated from one another. The metallization layer interconnects 13 each include a core 130 and a liner 131. The core 130 is slightly tapered inwardly with increasing distance from an upper surface 120 of the first dielectric layer 12 and can be formed of metallic materials such as copper (Cu), aluminum (Al) or another similar material. The liner 131 can include an inner liner 1310 formed of at least one of cobalt (Co), ruthenium (Ru) and/or tantalum (Ta) and an outer liner 1311 formed of at least one of Ta and/or tantalum nitride (TaN).

As used herein, the wafer 10 can refer to a wafer and to a chip, a die or an integrated circuit (IC) that is included on the wafer 10. Thus, it is to be understood that, in accordance with some embodiments of the invention, the wafer 10 includes one or more chips, dies or ICs formed thereon. It is to be further understood that once the wafer 10 is fully fabricated, the wafer 10 may be cut or diced into its component chips, dies or ICs.

The metallization layer interconnects 13 can be provided at a substantially uniform distance D apart, have bottom layers that are suspended above an upper surface 110 of the substrate 11 by a substantially uniform height H and have respective upper surfaces 132 that are at least initially coplanar with the upper surface 120. The metallization layer interconnects 13 can be grouped into at least two groups: first (or outer) metallization layer interconnects 133 and second (or central or lateral) metallization layer interconnects 134. The second metallization layer interconnects 134 are adjacent one another and surrounded by the first metallization layer interconnects 133. At least one of the second metallization layer interconnects 134 can be a central metallization layer interconnect 1340 and the two adjacent ones can be lateral metallization layer interconnects 1341.

Figure 4:
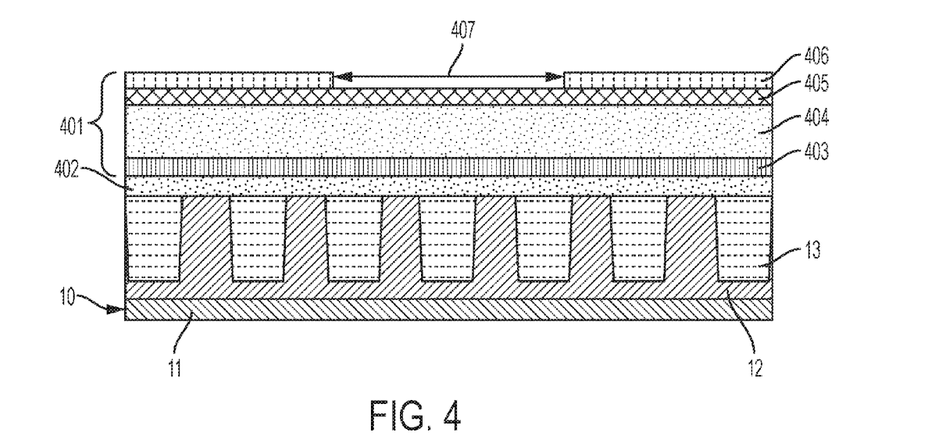
FIG. 4 is a side view of the wafer of FIG. 2 including lithographic layers deposited thereon with an air gap mask in accordance with embodiments of the invention.

With reference to FIG. 4, lithographic layer fabrication with an air gap mask is conducted. In accordance with embodiments, the air gap mask may include a special airgap/FAV mask that is a tone-inverted version of a conventional airgap mask. In detail, a patterning stack 401 is deposited onto the upper surface 120 and the respective upper surfaces 132. The patterning stack 401 includes a sacrificial nitride layer 402 disposed on the upper surface 120 and the respective upper surfaces 132, a titanium nitride (TiN) layer 403 disposed on the sacrificial nitride layer 402, an organic planarization layer 404 disposed on the TiN layer 403, an anti-reflection coating 405 disposed on the organic planarization layer 404 and a photoresist layer 406 disposed on portions of the anti-reflection coating 405. The photoresist layer 406 is formed to define an aperture 407 that corresponds in width to the width of the central metallization layer interconnect 1340, the adjacent stacks of the first dielectric layer 12 and width-wise portions of the lateral metallization layer interconnects 1341. The photoresist layer 406 thus acts as and defines an extent of the air gap mask.

Figure 5:
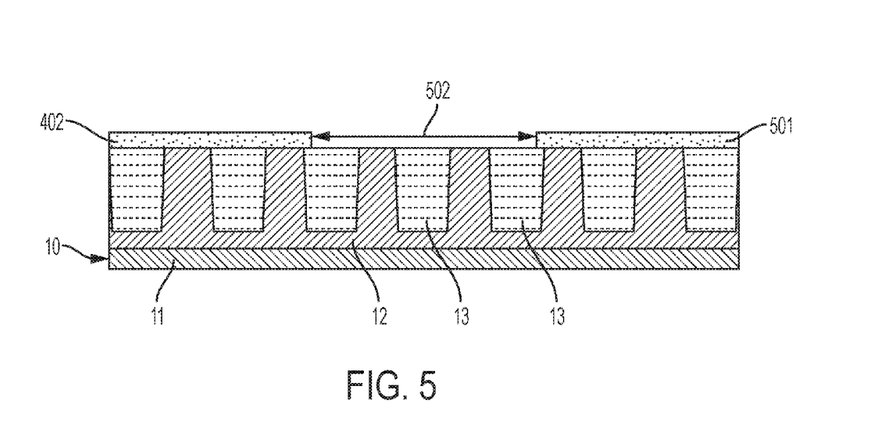
FIG. 5 is a side view of the wafer of FIG. 4 in which the lithographic layers have been removed but for an open hard mask in accordance with embodiments of the invention.

With reference to FIG. 5, the patterning stack 401 is removed down to the sacrificial nitride layer which acts as a hard mask 501. The hard mask 501 is thus provided generally where the photoresist layer 406 was disposed and is formed to define a hard mask aperture 502 in accordance with the location of the aperture 407.

The deposition and subsequent removal of the patterning stack 401 is the only masking process undertaken in the overall process described herein.

Figure 6:
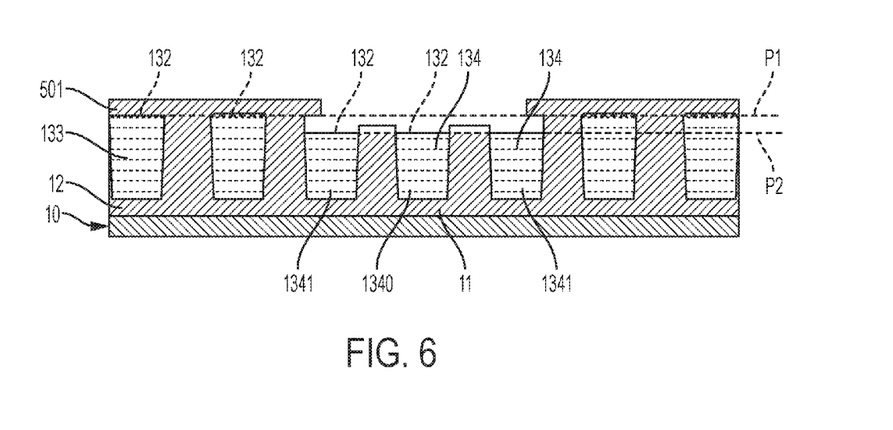
FIG. 6 is a side view of the wafer of FIG. 5 in which central and lateral metallization layer interconnects are recessed in accordance with embodiments of the invention.

With reference to FIG. 6, the central metallization layer interconnect 1340 and the lateral metallization layer interconnects 1341 are recessed through the hard mask aperture 502. The recessing can be accomplished by a wet etch process, for example, that is localized by the hard mask 501 to only take effect at the central metallization layer interconnect 1340 and the lateral metallization layer interconnects 1341. The recessing can but does not need to also have effect on the stacks of the first dielectric layer 12 adjacent to the central metallization layer interconnect 1340. In any case, while the respective upper surfaces 132 of the first metallization layer interconnects 133 define a first plane P1, as a result of the recessing, the respective upper surfaces 132 of the second metallization layer interconnects 134 (i.e., the central metallization layer interconnect 1340 and the lateral metallization layer interconnects 1341) define a second plane P2 that is recessed from the first plane P1 toward the upper surface 110 of the substrate 11.

Figure 7:
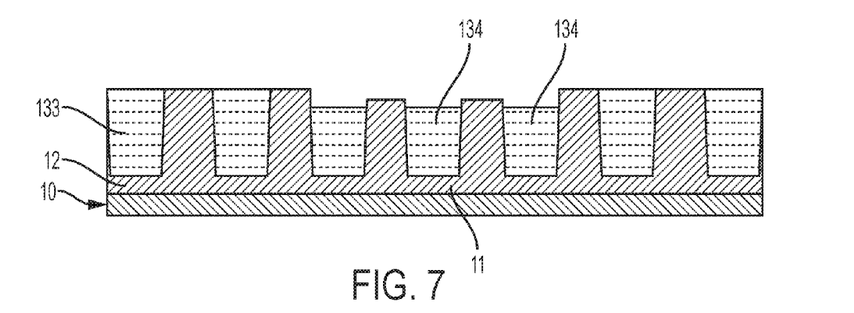
FIG. 7 is a side view of the wafer of FIG. 6 in which a hard mask has been removed in accordance with embodiments of the invention.

With reference to FIG. 7, following the recessing, the hard mask 501 is removed. Such removal can be accomplished by an HF anneal or another similar process.

Figure 8:
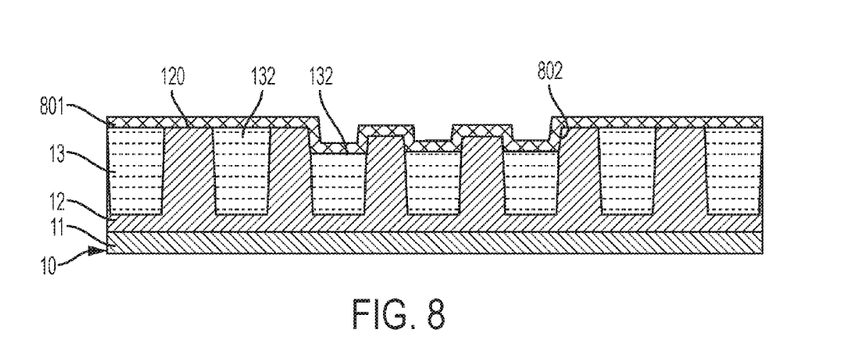
FIG. 8 is a side view of the wafer of FIG. 7 with a protective cap deposited thereon in accordance with embodiments of the invention.

With reference to FIG. 8, a protective cap 801 is deposited onto the upper surface 120 of the first dielectric layer 12, on the respective upper surfaces 132 of the first metallization layer interconnects 133, on the respective upper surfaces 132 of the second metallization layer interconnects 134 and on portions 802 of the first dielectric layer 12 that are proximate to or adjacent the second metallization layer interconnects 134. The protective cap 801 can be formed of silicon carbon nitride (SiCN) or another similar material.

Figure 9:
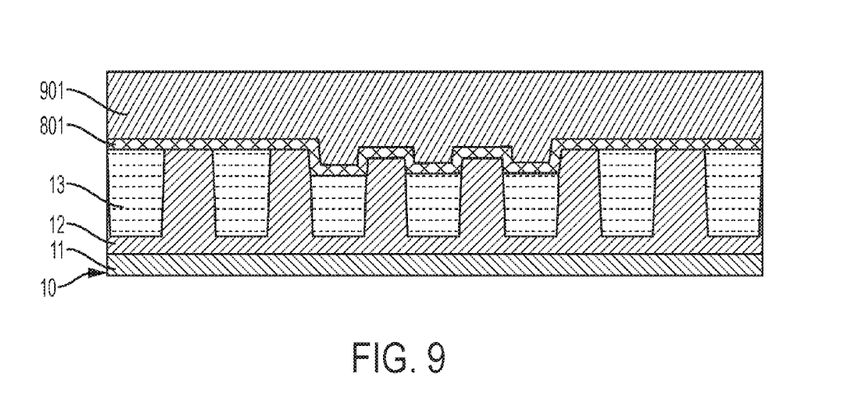
FIG. 9 is a side view of the wafer of FIG. 8 with a dielectric material deposited thereon in accordance with embodiments of the invention.

With reference to FIG. 9, a gap-filling, spin-on and flowable dielectric layer 901 is deposited onto the protective cap 801.

Figure 10:
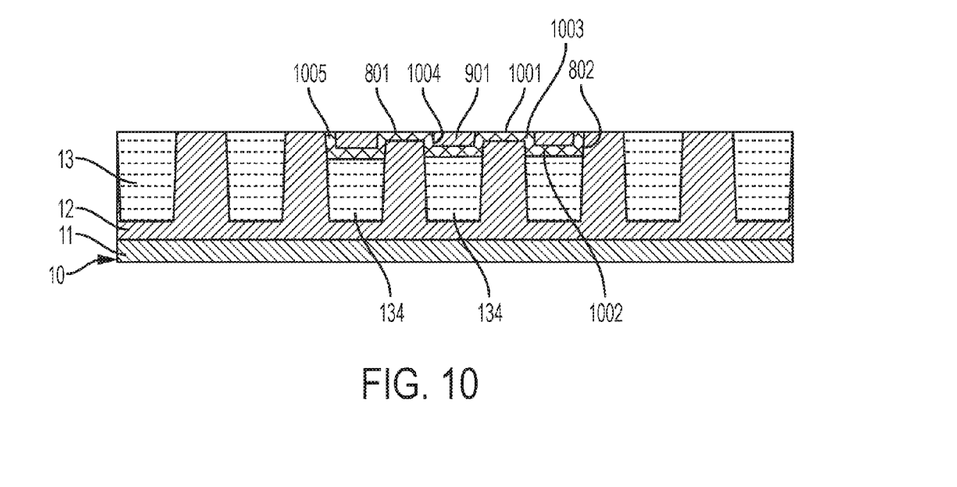
FIG. 10 is a side view of the wafer of FIG. 9 with the dielectric material and the protective cap removed outside of the recessed metallization layer interconnects in accordance with embodiments of the invention.

At this point, with reference to FIG. 10, a planarization process is executed to remove most or all of the gap-filling, spin-on and flowable dielectric layer 901 and to remove all of the portions of the protective cap 801 but for those portions that are deposited onto the respective upper surfaces 132 of the second metallization layer interconnects 134 and the portions 802 of the first dielectric layer 12. The planarization process can be conducted by chemical mechanical processing (CMP) or another similar process.

The remainder 1001 of the protective cap 801 thus includes lower surfaces 1002 that lie along the respective upper surfaces 132 of the central metallization layer interconnect 1340 and the lateral metallization layer interconnects 1341, upper surfaces 1003 that lie along upper surfaces of the stacks of the first dielectric layer 12 adjacent to the central metallization layer interconnect 1340, interior sidewalls 1004 extending between the lower surfaces 1002 and the upper surfaces 1003 and exterior sidewalls 1005 extending upwardly from distal edges of the lower surfaces 1002 lying along the respective upper surfaces 132 of the lateral metallization layer interconnects 1341.

As shown in FIG. 10, the portion of the gap-filling, spin-on and flowable dielectric layer 901 between the exterior sidewalls 1005 can be retained though it is to be understood that this portion of the gap-filling, spin-on and flowable dielectric layer 901 between the exterior sidewalls 1005 can be also be removed.

Figure 11:
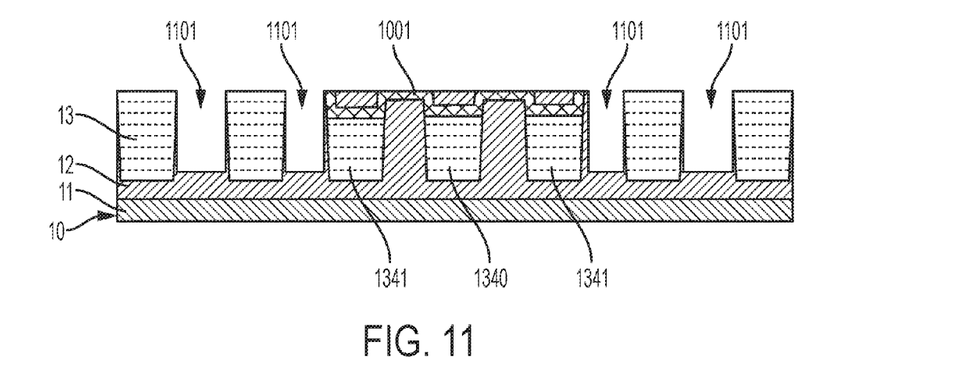
FIG. 11 is a side view of the wafer of FIG. 10 with air gap regions formed in accordance with embodiments of the invention.

With reference to FIG. 11, air gap regions 1101 are formed in the stacks of the first dielectric layer 12 which are adjacent to the first metallization layer interconnects 133 by, for example, an etching process. The air gap regions 1101 are not formed, however, in any region that remains protected by the remainder 1001 of the protective cap 801 (to the extent that any of the gap-filling, spin-on and flowable dielectric layer 901 is retained, it can serve as a protection mask for the etching process). Thus, the air gap regions 1101 are not provided or formed in the stack of the first dielectric layer 12 adjacent to the central metallization layer interconnect 1340. As shown in FIG. 11, these air gap regions 1101 can be substantially polygonal or rectangular with substantially vertical sidewalls and substantially horizontal lower surfaces. The substantially horizontal lower surfaces can be but do not need to be slightly raised above the respective heights of the bottom layers of the metallization layer interconnects 13.

Figure 12:
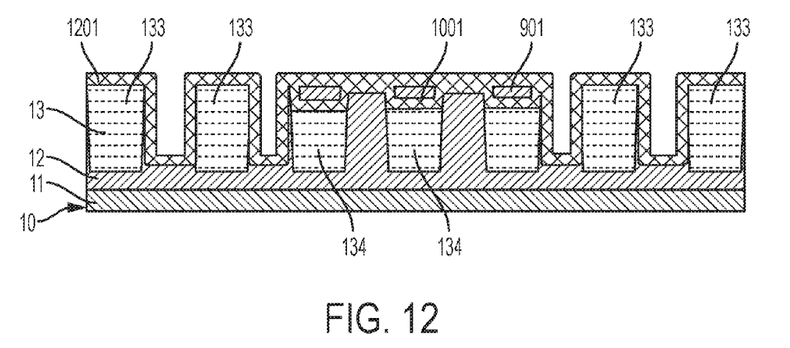
FIG. 12 is a side view of the wafer of FIG. 11 with a secondary cap deposited thereon in accordance with embodiments of the invention.

With reference to FIG. 12, a conformal dielectric cap 1201 is deposited onto exposed surfaces of the first metallization layer interconnects 133, exposed surfaces of the first dielectric layer 12, the remainder 1001 of the protective cap 801 and remaining portions of the gap-filling, spin-on and flowable dielectric layer 901.

Figure 13:
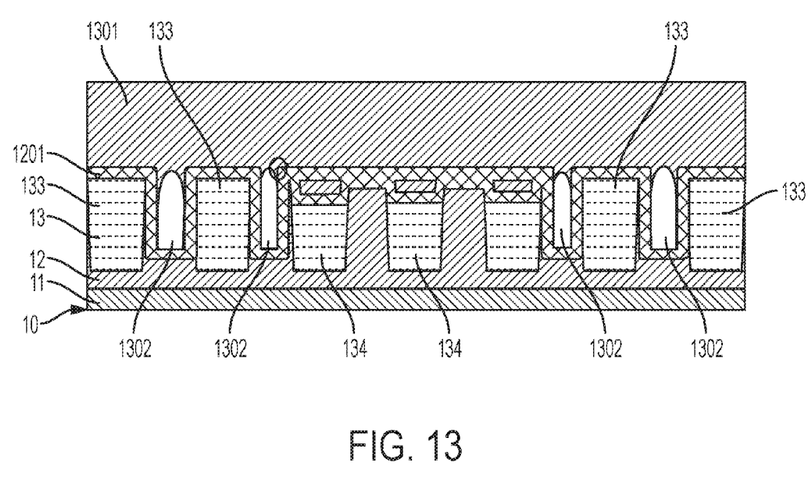
FIG. 13 is a side view of the wafer of FIG. 12 with a secondary dielectric layer deposited thereon to form air gaps in the air gap regions in accordance with embodiments of the invention.

Subsequently, with reference to FIG. 13, a secondary dielectric layer 1301 is deposited in a non-conformal manner. As used herein, conformal deposition is generally executed more slowly than non-conformal deposition such that, in this case, the secondary dielectric layer 1301 forms air gaps 1302 in the air gap regions 1101 adjacent to the first metallization layer interconnects 133. The airgaps 1302 tend to promote increased capacitance of the wafer 10 generally and the metallization layer interconnects 13 specifically.

Figure 14:
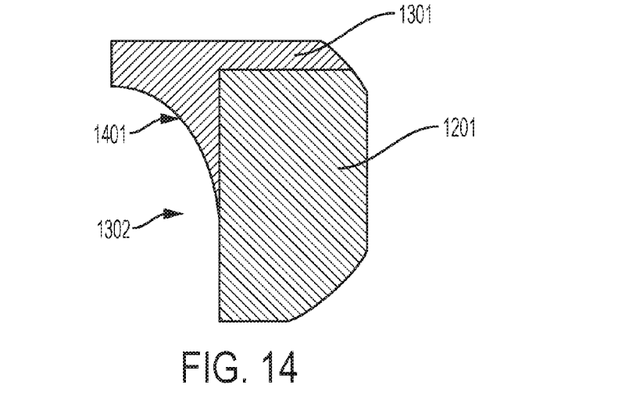
FIG. 14 is an enlarged view of the encircled portion of FIG. 13 in accordance with embodiments of the invention.

With reference to FIG. 14, the air gaps 1302 have curved and tapered sides 1401 that decrease in thickness with increasing depth.

Figure 15:
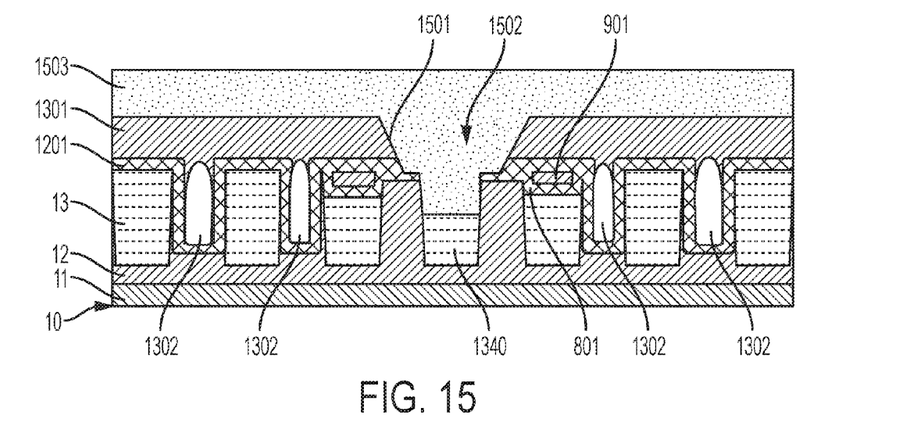
FIG. 15 is a side view of the wafer of FIG. 13 with a fully aligned via (FAV) formed to be electrically communicative with the central one of the recessed metallization layer interconnects in accordance with embodiments of the invention.

With reference to FIG. 15, a trench 1501 is formed in the secondary dielectric layer 1301, a central portion of the conformal dielectric cap 1201 and central portions of the remainder 1001 of the protective cap 801 and remaining portions of the gap-filling, spin-on and flowable dielectric layer 901 (if any). As shown in FIG. 15, the trench 1501 is tapered inwardly with increasing depth. At its widest, the trench 1501 can be at least as wide as the central metallization layer interconnect 1340 and the adjacent stacks of the first dielectric layer 12. At its narrowest, the trench 1501 can be slightly wider than the central metallization layer interconnect 1340.

Once formed, the trench 1501 can be filled such that a fully aligned via (FAV) 1502 is provided. The FAV 1502 is aligned and electrically communicative with the central metallization layer interconnect 1340 and extends upwardly through the secondary dielectric layer 1301, the central portion of the conformal dielectric cap 1201 and the central portions of the remainder 1001 of the protective cap 801 and remaining portions of the gap-filling, spin-on and flowable dielectric layer 901 (if any). The trench 1502 can also be electrically communicative with a metallization layer 1503 that is disposed on an upper surface of the secondary dielectric layer 1301.

Figure 16:
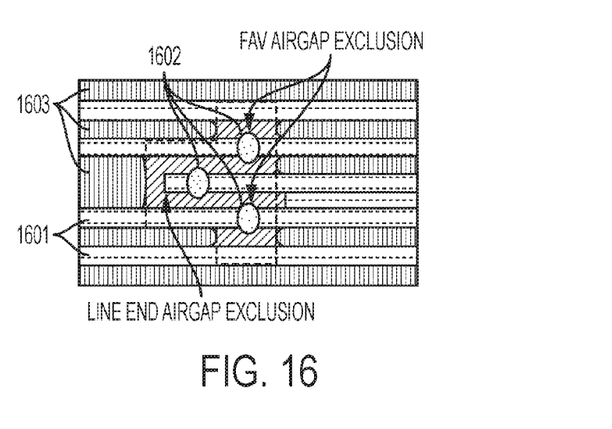
FIG. 16 is a top down illustration of FAV air gap exclusion and line end air gap exclusion.

With reference to FIG. 16, a top down view of a metallization layer including multiple metallization layer interconnects 1601 and FAVs 1602 is provided. As shown in FIG. 16, the FAVs 1602 need not be aligned with one another and can in fact be staggered in position. The dashed line illustrates the region of the metallization layer in which no airgaps are formed and those regions outside of the dashed line can be regions where the dielectric 1603 can be formed to include the air gaps.

Figure 17:
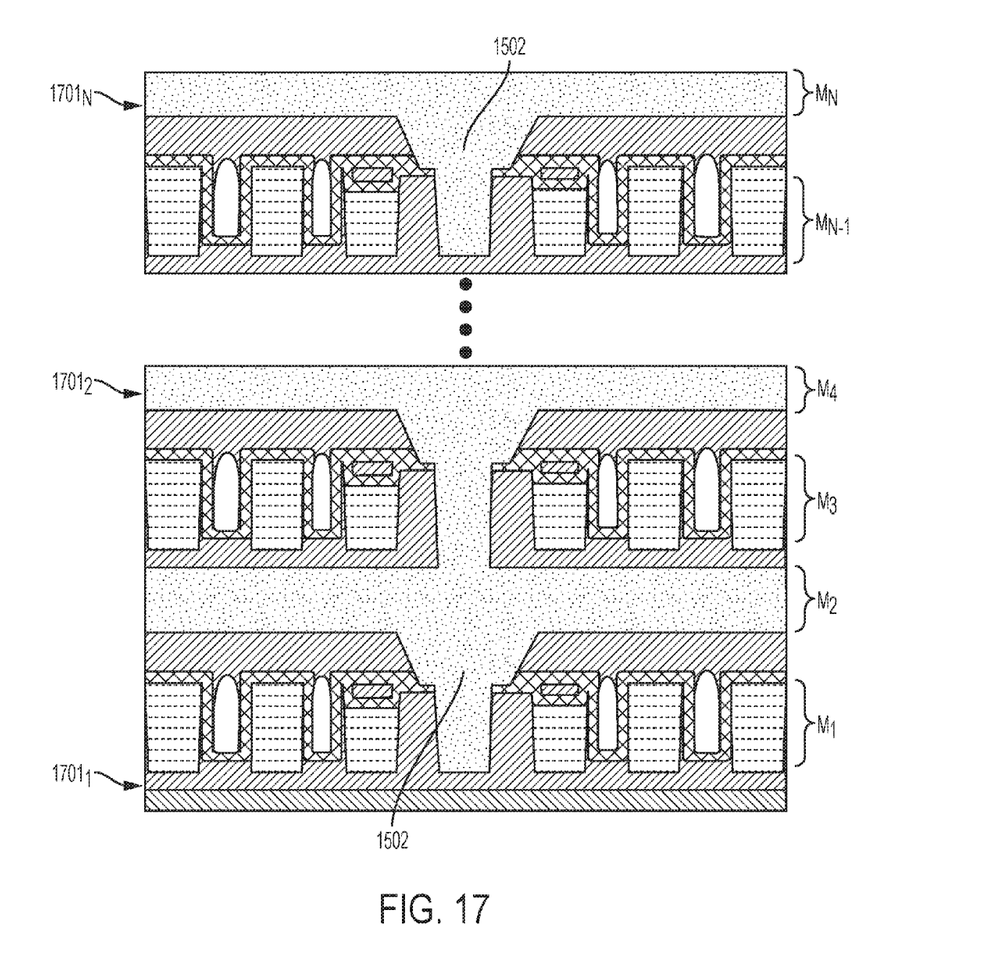
FIG. 17 is a side view of a wafer including multiple wafer layers in accordance with embodiments of the invention.

In accordance with further embodiments of the invention and with reference to FIG. 17, the wafer 10 can be provided with multiple wafer layers $1701_1, 1701_2, \ldots, 1701_N$ stacked in a vertical direction that each include one or more respective metallization layers $M_1, M_2, \ldots, M_{N-1}, M_N$. That is, as shown in FIG. 17, wafer layer $1701_1$ includes metallization layers $M_1$ and $M_2$ as well as FAV 1502, as described above, by which at least one of the metallization layer interconnects of metallization layer $M_2$ is electrically communicative with at least one of the metallization layer interconnects of metallization layer $M_1$. Similarly, wafer layer $1701_N$ includes metallization layers $M_{N-1}$ and $M_N$ as well as FAV 1502, as described above, by which at least one of the metallization layer interconnects of metallization layer $M_N$ is electrically communicative with at least one of the metallization layer interconnects of metallization layer $M_{N-1}$.

It is to be understood that, although, FIG. 17 illustrates that the FAVs 1502 are provided to form connections between adjacent or sequential metallization layers, this is not required and that the FAVs 1502 can actually provide for interlayer connections that extend across two or more (i.e., multiple) layers. For example, the FAV 1502 of wafer layer $1701_N$ can provide for electrically communication with at least one of the metallization layer interconnects of metallization layer $M_{N-1}$ and/or at least one of the metallization layer interconnects of one or more of metallization layers $M_{N-2, N-3, \ldots 2, 1}$.

Figure 18:
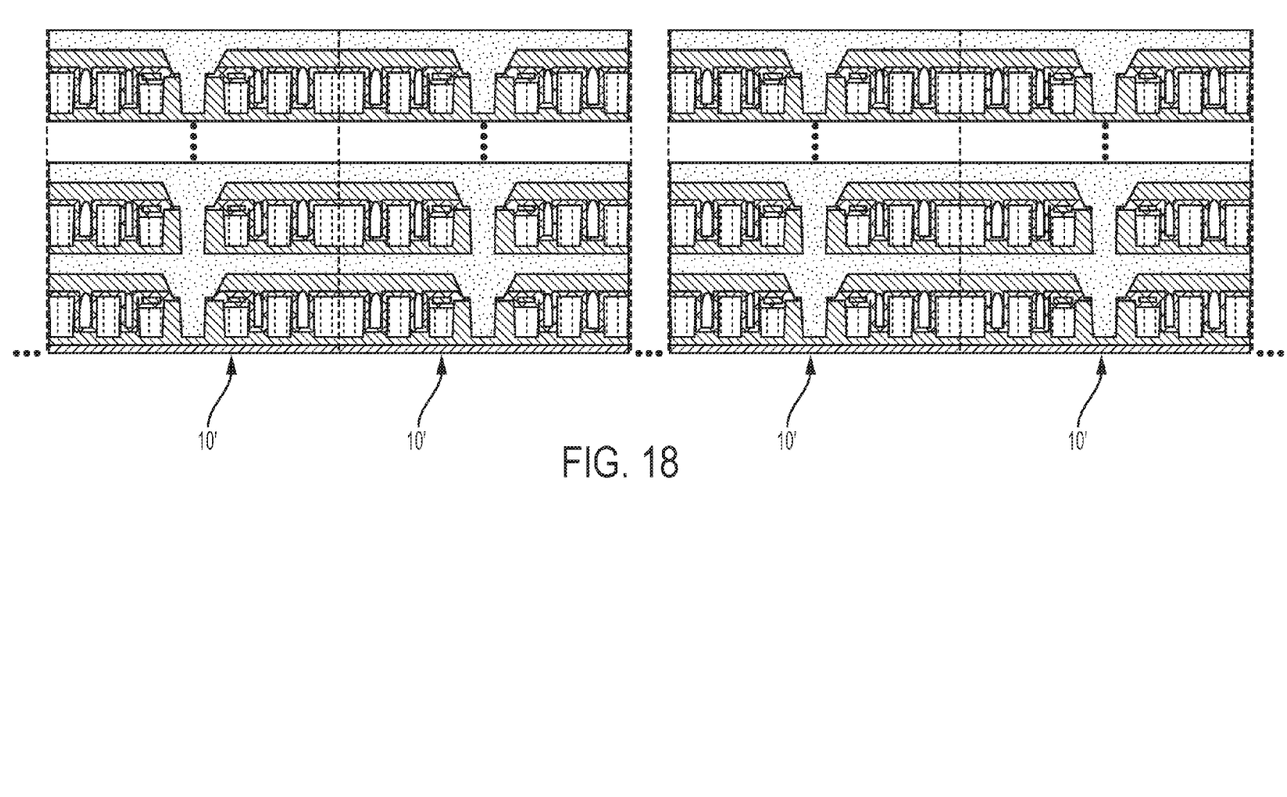
FIG. 18 is a side view of a wafer including multiple wafer layers that can be diced into multiple individual chips, dies or integrated circuits (ICs) in accordance with embodiments of the invention.

In accordance with still further embodiments of the invention and with reference to FIG. 18, the wafer 10 of FIG. 17 can be diced along dice lines into a plurality of individual chips, dies or ICs 10'. In such cases, each individual chip, die or IC 10' includes the multiple wafer layers $1701_1, 1701_2, \ldots, 1701_N$ stacked in the vertical direction with each including the one or more respective metallization layers $M_1, M_2, \ldots, M_{N-1}, M_N$.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A processing method for a wafer comprising central, lateral and outer metallization layer interconnects arrayed across a dielectric layer, the processing method comprising:
    using a single mask exposure to recess only the central and lateral metallization layer interconnects;
    forming air gaps in a secondary dielectric layer in defined air gap regions adjacent to the outer metallization layer interconnects; and forming a fully-aligned via (FAV) through at least the secondary dielectric for electrical communication with the central metallization layer interconnect.

2. The processing method according to claim 1, wherein using the single mask exposure comprises depositing a lithographic layer with an air gap mask.

3. The processing method according to claim 1, wherein forming the air gaps in the secondary dielectric comprises non-conformal deposition of the secondary dielectric.

4. The processing method according to claim 1, wherein the central, lateral and outer metallization layer interconnects and the FAV each comprise:
   a metallic material; and
   a lining at least partially surrounding the metallic material, wherein:
   the lining comprises an interior lining of a first material and an exterior lining of a second material,
   the first material comprises one of tantalum (Ta) or tantalum nitride (TaN), and
   the second material comprises one of cobalt (Co), ruthenium (Ru) or Ta.

5. The processing method according to claim 1, wherein the secondary dielectric layer has curved and tapered surfaces at the air gaps.

6. The processing method according to claim 1 further comprising forming a metallization layer over a remainder of the secondary dielectric layer and electrically coupling the FAV with the metallization layer.

7. A processing method for a wafer comprising central, lateral and outer metallization layer interconnects arrayed across a dielectric layer, the processing method comprising:
   recessing the central and lateral metallization layer interconnects;
   forming a protective cap over the recessed central and lateral metallization layer interconnects;
   defining air gap regions adjacent to the outer metallization layer interconnects in the dielectric layer;
   forming a secondary cap on exposed surfaces of the lateral and outer metallization layer interconnects, the dielectric layer and the protective cap;
   non-conformally depositing a secondary dielectric layer over the secondary cap to form air gaps in the air gap regions;
   defining a trench extending through the secondary dielectric layer, the secondary cap and the protective cap to the central metallization layer interconnect; and
   forming a fully-aligned via (FAV) in the trench for electrical communication with the central metallization layer interconnect.

8. The processing method according to claim 7, wherein recessing the central and lateral metallization layer interconnects comprises using a single mask exposure through deposition of a lithographic layer with an air gap mask.

9. The processing method according to claim 7, wherein the central, lateral and outer metallization layer interconnects and the FAV each comprise:
   a metallic material; and
   a lining at least partially surrounding the metallic material, wherein:
   the lining comprises an interior lining of a first material and an exterior lining of a second material,
   the first material comprises one of tantalum (Ta) or tantalum nitride (TaN), and
   the second material comprises one of cobalt (Co), ruthenium (Ru) or Ta.

10. The processing method according to claim 7, wherein the protective cap and the secondary cap comprise silicon carbon nitride (SiCN).

11. The processing method according to claim 7, wherein the secondary dielectric layer has curved and tapered surfaces at the air gaps.

12. The processing method according to claim 7 further comprising forming a metallization layer over a remainder of the secondary dielectric layer and electrically coupling the FAV with the metallization layer.

* * * * *